US012604763B2

(12) United States Patent (10) Patent No.: US 12,604,763 B2
Sundgren et al. (45) Date of Patent: Apr. 14, 2026

(54) METHOD FOR PRODUCING A PLURALITY OF COMPONENTS, COMPONENT, AND COMPONENT ASSEMBLY

(71) Applicant: OSRAM Opto Semiconductors GmbH, Regensburg (DE)

(72) Inventors: Petrus Sundgren, Lappersdorf (DE); Andreas Biebersdorf, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 1104 days.

(21) Appl. No.: 17/600,668

(22) PCT Filed: Mar. 6, 2020

(86) PCT No.: PCT/EP2020/056045
§ 371 (c)(1),
(2) Date: Oct. 1, 2021

(87) PCT Pub. No.: WO2020/200645
PCT Pub. Date: Oct. 8, 2020

(65) Prior Publication Data
US 2022/0181308 A1 Jun. 9, 2022

(30) Foreign Application Priority Data
Apr. 3, 2019 (DE) .......................... 102019108701.5

(51) Int. Cl.
*H10W 90/00* (2026.01)
*H10H 20/01* (2025.01)
(Continued)

(52) U.S. Cl.
CPC .......... *H10W 90/00* (2026.01); *H10H 20/856* (2025.01); *H10H 20/036* (2025.01)

(58) Field of Classification Search
CPC .............. H01L 25/0753; H10H 20/018; H10H 20/824; H01S 5/0217
See application file for complete search history.

(56) References Cited

U.S. PATENT DOCUMENTS 8,088,649 B2 1/2012 Harle et al.
8,247,251 B2 8/2012 Kim
(Continued)

FOREIGN PATENT DOCUMENTS

CN 105210200 A 12/2015
CN 107210335 A 9/2017
(Continued)

OTHER PUBLICATIONS

Japanese Notice of Reasons for Rejection (with English Translation) in Japanese Application No. 2021-556857 mailed on Nov. 8, 2022, 9 pages.
(Continued)

*Primary Examiner* — Antonio B Crite
(74) *Attorney, Agent, or Firm* — MH2 Technology Law Group LLP

(57) ABSTRACT

The invention relates to a composite component made of a plurality of components, a modified sacrificial layer and a common intermediate carrier, in which the components each have a semiconductor body with an active zone, the semiconductor bodies being arranged on the intermediate carrier and being laterally spaced apart from one another by means of isolating trenches. The sacrificial layer is arranged in the vertical direction between the intermediate carrier and the semiconductor bodies, the sacrificial layer having a plurality of retaining elements between the semiconductor bodies and the common intermediate carrier, and the semiconductor bodies being mechanically connected to the intermediate carrier only by means of the retaining elements. The retaining elements are surrounded by cavities in lateral directions.
(Continued)

The semiconductor bodies are designed to be detachable from the intermediate carrier, wherein the retaining elements release the semiconductor bodies from the intermediate carrier under mechanical strain or by means of irradiation or by means of etching. The invention further relates to a component having a semiconductor body which is detached from a composite component of this type, and to a method for producing a plurality of components of this type.

16 Claims, 7 Drawing Sheets

(51) Int. Cl.

| | |
|---|---|
| *H10H 20/824* | (2025.01) |
| *H10H 20/856* | (2025.01) |
| *H10H 20/857* | (2025.01) |

(56) References Cited

U.S. PATENT DOCUMENTS

| | | | |
|---|---|---|---|
| 9,165,816 | B2 | 10/2015 | Zull et al. |
| 10,411,155 | B2 | 9/2019 | Zini et al. |
| 2010/0151609 | A1 * | 6/2010 | Kim .................... H10H 20/018 438/33 |
| 2010/0261300 | A1 | 10/2010 | Tu et al. |
| 2013/0196474 | A1 | 8/2013 | Meitl et al. |
| 2014/0084240 | A1 | 3/2014 | Hu et al. |
| 2014/0084482 | A1 | 3/2014 | Hu et al. |
| 2016/0104819 | A1 | 4/2016 | Schmid et al. |
| 2017/0207363 | A1 | 7/2017 | Zini et al. |
| 2018/0145058 | A1 | 5/2018 | Meitl et al. |
| 2020/0144460 | A1 * | 5/2020 | Onuma .................... G09G 3/32 |

FOREIGN PATENT DOCUMENTS

| | | |
|---|---|---|
| DE | 102011015725 A1 | 10/2012 |
| DE | 102014110884 A1 | 2/2016 |
| JP | 2011066056 A | 3/2011 |
| JP | 2015012176 A | 1/2015 |
| JP | 2016522992 A | 8/2016 |
| JP | 2018506850 | 3/2018 |
| KR | 10-2010-0068839 A | 6/2010 |
| KR | 10-2018-0121614 A | 11/2018 |
| WO | 2007/124737 A1 | 11/2007 |
| WO | 2008/036837 A2 | 3/2008 |
| WO | 2012/078139 A1 | 6/2012 |
| WO | 2017153123 A1 | 9/2017 |
| WO | 2018149666 | 8/2018 |
| WO | 2018177810 | 10/2018 |

OTHER PUBLICATIONS

Lee, S. J., English Translation of Korean Examination Report issued in Korean Patent Application No. 10-2021-7031187 dated Aug. 16, 2023, 10 pages.

International Search Report and Written Opinion issued Jun. 2, 2020 in corresponding Application No. PCT/EP2020/056045 with English translation of Search Report provided, 11 pages.

Chinese Office Action issued in corresponding Chinese Patent Application No. 202080027226.4 dated Sep. 10, 2024, with English language translation, 21 pages.

* cited by examiner

METHOD FOR PRODUCING A PLURALITY OF COMPONENTS, COMPONENT, AND COMPONENT ASSEMBLY

CROSS-REFERENCE TO RELATED APPLICATIONS

This patent application is a national stage entry from International Application No. PCT/EP2020/056045, filed on Mar. 6, 2020, published as International Publication No. WO 2020/200645 A1 on Oct. 8, 2020, and claims priority under 35 U.S.C. § 119 from German patent application 10 2019 108 701.5, filed Apr. 3, 2019, the entire contents of all of which are incorporated by reference herein.

FIELD

A method for producing a plurality of components, in particular of transferable and thus printable components, is disclosed. Furthermore, a component and a component assembly comprising a plurality of components are disclosed.

BACKGROUND

When transferring components, structures are preferably required with which the components are held in an orderly and stable manner on an intermediate carrier before they are removed from the intermediate carrier in a targeted and secure manner, for example using an adhering stamp, and applied to a mounting surface. For this purpose, anchor structures can be formed that temporarily secure the components to the intermediate carrier. It has been found that the formation of such anchor structures and the secure detachment of the components from the intermediate carrier involve a great deal of effort and care. The montage of a large number of components is therefore time-consuming and cost-intensive.

SUMMARY

One object is to provide a reliable and cost-efficient method for producing a plurality of components or for producing a component assembly which can be assembled quickly and in a simplified manner on a predetermined target surface. A further object is to provide such a component assembly or a component detached from the component assembly.

These objects are solved by the component assembly, the component and the method for producing a plurality of components according to the independent claims. Further designs and further developments of the method or of the component assembly or of the component are the subject of the further claims.

According to at least one embodiment of a method for producing a plurality of components, in particular for optoelectronic devices, a semiconductor structure is provided on an intermediate carrier. In particular, a sacrificial layer is arranged in vertical direction between the semiconductor structure and the intermediate carrier. For example, the semiconductor structure is based on a III-V or II-VI compound semiconductor material. The semiconductor structure may include a first semiconductor layer of a first type of charge carrier and a second semiconductor layer of a second type of charge carrier. In particular, the semiconductor structure has an optically active zone which is disposed between the first semiconductor layer and the second semiconductor layer and is configured, for example, to generate or detect electromagnetic radiation. The semiconductor structure may be divided into a plurality of laterally spaced semiconductor bodies each having regions of the first semiconductor layer, of the second semiconductor layer, and of the optically active zone of the semiconductor structure.

The intermediate carrier can be a growth substrate on which the semiconductor structure is epitaxially grown. The semiconductor structure and the sacrificial layer may be based on the same semiconductor material system. For example, the sacrificial layer is a buffer layer between the semiconductor structure and the intermediate carrier, wherein the semiconductor structure, the sacrificial layer and the intermediate carrier may be based on the same III-V or II-VI compound semiconductor material. If the semiconductor structure, the sacrificial layer and the intermediate carrier are based on the same III-V compound semiconductor material, the semiconductor structure, the sacrificial layer and the intermediate carrier have a same element from the third main group, for example B, Al, Ga or In, and a same element from the fifth main group, for example N, P or As.

The term III-V compound semiconductor material includes in particular the group of binary, ternary or quaternary compounds containing at least one element from the third main group and at least one element from the fifth main group, for example nitride or phosphide compound semiconductors. Such a binary, ternary or quaternary compound may further comprise dopants as well as additional constituents. For example, the intermediate carrier is a GaAs growth substrate and the sacrificial layer is an AlGaAs layer. The semiconductor structure may be a layered sequence of GaAs compound semiconductor materials, in particular of binary, ternary or quaternary GaAs compounds.

It is possible that the intermediate carrier is different from a growth substrate. For example, the intermediate carrier is made from a compound semiconductor material, silicon, germanium, ceramic, glass, or from a plastic material. In this case, the sacrificial layer may further be a semiconductor layer or different from a semiconductor layer.

According to at least one embodiment of the method, a plurality of separation trenches are formed throughout the semiconductor structure to form a plurality of laterally spaced semiconductor bodies, wherein the semiconductor bodies each comprise a region of the active zone of the semiconductor structure. In particular, the separation trenches extend along the vertical direction throughout the semiconductor structure. In the separation trenches, the sacrificial layer may be exposed, partially removed, or completely removed. By forming the separation trenches, the sacrificial layer may form a plurality of retaining elements. When the sacrificial layer in the separation trenches is completely removed, a surface of the intermediate carrier may be partially exposed.

A lateral direction is understood to be a direction that runs in particular parallel to a main extension surface of the intermediate carrier and/or of the component. For example, the lateral direction is parallel to the sacrificial layer. A vertical direction is understood to be a direction that is directed, in particular, perpendicular to the main extension surface of the intermediate carrier and/or of the component. The vertical direction and the lateral direction are for instance orthogonal to each other.

According to at least one embodiment of the method, the sacrificial layer is partially removed in such a way that cavities are formed in the vertical direction between the intermediate carrier and the semiconductor bodies. These cavities may be directly connected to the separation trenches. In top view of the intermediate carrier, the cavities may be at least partially or completely covered by the semiconductor bodies. For example, the cavities are formed by an etching process. The etchants required for this can be fed into the separation trenches or into further entry channels for achieving a lateral local etching of the sacrificial layer. In particular, the remaining regions of the sacrificial layer form retaining elements that continue to form a mechanical connection between the intermediate carrier and the semiconductor bodies. It is possible that the individual laterally spaced semiconductor bodies are mechanically connected to the intermediate carrier solely by the retaining elements. In top view of the intermediate carrier, the semiconductor bodies may overlap with the retaining elements and as well as with the cavities.

It is also possible that the cavities are formed exclusively by the separation trenches. In this case, the cavities are located laterally to the semiconductor bodies and do not overlap with the semiconductor bodies in top view.

In top view, each individual semiconductor body may partially or completely cover a single retaining element or a plurality of retaining elements. It is also possible that, in top view of the intermediate carrier, several adjacent semiconductor bodies cover a common retaining element. In this case, the common retaining element may partially or completely cover at least one separation trench. The laterally spaced semiconductor bodies are mechanically connected to each other via the common retaining element.

The semiconductor bodies each have a main surface facing the intermediate carrier, which is covered in regions by the retaining element or by the retaining elements and is free in regions from being covered by the retaining element or by the retaining elements. For example, at most 30%, 40%, 50%, 60%, 70% or at most 80% of the main surface of the semiconductor body are covered by the retaining element or by the retaining elements. On the other hand, at least 10%, 20%, 30%, or at least 33% of the main surface of the semiconductor body may be covered by the retaining element or by the retaining elements.

According to at least one embodiment of the method, the remaining sacrificial layer is modified. For example, the retaining elements are oxidized. Due to the oxidation, the resulting change in the porosity or structure of the material of the retaining elements may lead to a reduction in the mechanical adhesion between the semiconductor bodies and the intermediate carrier. Under mechanical load, the retaining elements may be mechanically broken or detached from the semiconductor bodies or from the intermediate carrier, thereby releasing the semiconductor bodies from the intermediate carrier. The semiconductor bodies can thus be formed to be detachable from the intermediate carrier, wherein the retaining elements release the semiconductor bodies from the intermediate carrier under mechanical load. Thus, either the interface between these two layers opens up, or the material of the retaining structure breaks down.

The retaining elements may thus be formed of a porous material. The porosity of the material of the retaining elements may be between 1% and 50%, for example between 1% and 40% inclusive, 1% and 30%, 1% and 20%, 1% and 10%, or between 10% and 50% inclusive, 15% and 50%, or between 20% and 50% inclusive. In case of doubt, the porosity is to be understood as an average porosity, which is a ratio of cavity volume to total volume of the retaining element or of the sacrificial layer in question. Furthermore, the adhesion force can be reduced by the fact that the modification, in particular the oxidation, does not create porosity but changes the lattice structure of the semiconductor material, e.g. from a crystalline semiconductor material into an amorphous, polycrystalline or glassy material.

It is also possible that the modification takes place by chemical change, mechanical change or crystallographic change of the retaining elements or of the material of the retaining elements. In other words, the modification of the retaining elements can be modification of a crystallographic and/or of chemical nature, which can be produced, for example, by temperature change, pressure change, application of solvents and/or by other chemical or mechanical influences.

In at least one embodiment of a method for producing a plurality of components each having a semiconductor body having an active zone, a semiconductor structure is provided on an intermediate carrier, wherein a sacrificial layer is disposed in a vertical direction between the semiconductor structure and the intermediate carrier. A plurality of separation trenches are formed throughout the semiconductor structure to form a plurality of laterally spaced semiconductor bodies. In particular, the sacrificial layer forms retaining elements. For reducing mechanical adhesion between the semiconductor bodies and the intermediate carrier, the retaining elements are modified, in particular oxidized, so that the semiconductor bodies are formed to be detachable from the intermediate carrier. For example, the retaining elements can release the semiconductor bodies from the intermediate carrier under mechanical load. It is also possible for the semiconductor bodies to be released from the intermediate carrier by irradiation or by etching the retaining elements.

According to at least one embodiment of the method, after the formation of the separation trenches, the sacrificial layer is partially removed in such a way that cavities are formed in the vertical direction between the intermediate carrier and the semiconductor bodies, wherein the remaining partial regions of the sacrificial layer form the retaining elements. In top view of the intermediate carrier, the semiconductor bodies can overlap with the retaining elements as well as with the cavities.

According to at least one embodiment of the method, the semiconductor bodies are mechanically connected to the intermediate carrier exclusively via the modified, in particular oxidized, retaining elements after modification, for example after oxidation, wherein the components are formed to be detachable from the intermediate carrier and thus transferable. The semiconductor bodies can be detached from the intermediate carrier under mechanical load, by irradiation or by etching the retaining elements.

According to at least one embodiment of the method, the semiconductor bodies are removed from the intermediate carrier individually or in groups, in particular by one or by a plurality of stamps. Under mechanical load of the stamp or stamps, the retaining elements release the semiconductor bodies from the intermediate carrier. Thus, the retaining elements can be mechanically broken or detached from the intermediate carrier or from the semiconductor bodies. It is possible that residues or remnants of the retaining elements remain on the semiconductor body or on the semiconductor bodies. Prior to detachment from the stamp or stamps, the semiconductor bodies may be attached to a carrier or to several carriers.

According to at least one embodiment of the method, the semiconductor bodies are removed from the intermediate carrier individually or in groups. For releasing the semiconductor bodies from the intermediate carrier, an absorption layer can be irradiated, wherein the absorption layer is in particular part of the retaining elements. For example, the absorption layer is embedded in the middle of the retaining elements. Alternatively, the absorption layer may face the intermediate carrier or face the semiconductor bodies. The absorption layer can be an outer layer of the retaining elements, which limits the retaining elements in a vertical direction.

Irradiation can decompose the absorption layer, resulting in releasing the semiconductor bodies from the intermediate carrier. For example, the absorption layer is irradiated with laser light or UV light. In particular, the absorption layer, especially the material of the absorption layer, has a band gap smaller than the photon energy of the absorbed light. The band gap of the absorption layer may be smaller than a band gap of the intermediate carrier.

The absorption layer can be an outer layer of the retaining elements facing the intermediate carrier. The absorption layer can also be an outer layer of the retaining elements facing the semiconductor bodies. It is also possible that the absorption layer is an inner layer of the retaining elements. The absorption layer may be completely embedded in the respective retaining elements.

According to at least one embodiment of the method, the intermediate carrier is a growth substrate, wherein the sacrificial layer is a semiconductor layer epitaxially deposited on the intermediate carrier. The growth substrate may be formed from a semiconductor material. The semiconductor structure is in particular a semiconductor layer sequence of semiconductor layers deposited on the sacrificial layer.

According to at least one embodiment of the method, the semiconductor structure is a layer sequence epitaxially deposited on a growth substrate, wherein the semiconductor structure and the sacrificial layer are arranged in vertical direction between the growth substrate and the intermediate carrier. The sacrificial layer may be a semiconductor layer epitaxially deposited on the semiconductor structure. Alternatively, it is possible that the sacrificial layer is a fastening layer, which is in particular different from a semiconductor layer. The growth substrate can be removed in a subsequent method step, in particular after the semiconductor structure has been attached to the intermediate carrier. The intermediate carrier is in particular different from a growth substrate and can be formed from a material which is different from a semiconductor material.

A component assembly comprising a plurality of components and a common intermediate carrier is provided, wherein a sacrificial layer is disposed in the vertical direction between the common intermediate carrier and the semiconductor bodies of the components. In particular, the sacrificial layer has a plurality of laterally spaced sub-regions forming retaining elements between the intermediate carrier and the semiconductor bodies. The method described above is particularly suitable for the production of a component assembly described herein. The features described in connection with the component and component assembly can therefore also be used for the method, and vice versa.

In at least one embodiment of a component assembly, it comprises a plurality of components, a modified, in particular oxidized sacrificial layer and a common intermediate carrier. The components each have a semiconductor body comprising an active zone, wherein the semiconductor bodies are arranged on the intermediate carrier and are laterally spaced apart from one another by separation trenches. The sacrificial layer is arranged in the vertical direction between the intermediate carrier and the semiconductor bodies, wherein the sacrificial layer has a plurality of modified, in particular oxidized, retaining elements between the semiconductor bodies and the common intermediate carrier. Preferably, the semiconductor bodies are mechanically connected to the intermediate carrier exclusively via the retaining elements. The retaining elements are surrounded by cavities in lateral directions.

For example, in top view of the intermediate carrier, the semiconductor bodies overlap the retaining elements as well as the cavities. The semiconductor bodies are formed to be detachable from the intermediate carrier, wherein the retaining elements release the semiconductor bodies from the intermediate carrier, in particular under mechanical load or by irradiation or by etching.

The retaining elements hold the components in an orderly and sufficiently stable manner on the intermediate carrier before they can be removed from the intermediate carrier, either individually or in groups, in a targeted and secure manner for further processing steps. The components can thus be transferred individually or in groups and are thus printable. The components or the semiconductor bodies of the components can thus be removed from the intermediate carrier individually or in groups, for example by breaking and/or by detaching the retaining elements. In the same production process, for example in the same so-called "pick-and-place" process, the semiconductor bodies can be transferred to a target mounting surface, for example by using one stamp or several stamps, and are mechanically fixed thereon and/or electrically contacted therewith.

The target mounting surface can be a printed circuit board or a carrier of an electronic component. Such components can be used as light sources in general lighting or in a headlight of a motor vehicle. It is also conceivable that the components may find application in electronic components, cell phones, touch pads, laser printers, cameras, identification cameras, facial identification cameras, displays, or in systems comprising of LEDs, sensors, laser diodes, and/or detectors.

According to at least one embodiment of the method or of the component assembly, the retaining elements are arranged exclusively below the semiconductor bodies. In top view of the intermediate carrier, the semiconductor bodies may completely cover the retaining elements. Each of the retaining elements may be assigned to a single semiconductor body in a one-to-one manner, and vice versa. It is also possible for multiple retaining elements to be assigned to the same semiconductor body and, in top view, to be completely covered by that semiconductor body. When transferring a single semiconductor body, the neighboring semiconductor bodies can remain unaffected by this process, so that the transfer process can be carried out especially precisely.

According to at least one embodiment of the method or of the component assembly, at least one of the retaining elements is arranged below the semiconductor bodies as well as laterally of the semiconductor bodies in the separation trenches. The retaining element may be assigned to a plurality of semiconductor bodies at the same time, and thus may be covered by a plurality of semiconductor bodies at the same time. It is possible that several retaining elements are assigned to the same semiconductor body. In this case, a semiconductor body may partially cover several retaining elements in top view. Adjacent semiconductor bodies may share one common retaining element or several common retaining elements.

According to at least one embodiment of the method or of the component assembly, the retaining elements are formed to be breakable or detachable when the components are removed under mechanical load. In other words, the retaining elements are formed in such a way that they break or get detached when the associated component or the associated semiconductor body is removed. Mechanical breakage takes place in particular within a layer of the same material. If the retaining element is formed to be detachable, the detachment of the retaining element takes place in particular at an interface between two layers of different materials, for example at an interface between two partial layers of the sacrificial layer or of the retaining element, or at an interface between the retaining element and the component, or at an interface between the retaining element and the intermediate carrier.

According to at least one embodiment of the method or of the component assembly, the sacrificial layer is an aluminum-containing semiconductor layer. The modification, in particular the oxidation of such a semiconductor layer can be carried out in a particularly simplified manner.

According to at least one embodiment of the method or of the component assembly, the semiconductor bodies are based on GaAs or on GaP, wherein the sacrificial layer is an aluminum-containing GaAs or GaP layer. The sacrificial layer may be an AlGaAs layer or an AlGaP layer. The semiconductor body may have indium-containing semiconductor layers.

According to at least one embodiment of the method or of the component assembly, the sacrificial layer has several sublayers, for example at least two sublayers, wherein the sublayers have different modification rates. It is possible that the sublayers are based on the same material system, wherein the sublayers have different concentrations of aluminum or different dopants.

According to at least one embodiment of the method or of the component assembly, the sacrificial layer has a first sublayer and a second sublayer arranged between the first sublayer and the semiconductor bodies. Thus, the corresponding retaining element may also have a first sub-layer and a second sub-layer. The first sub-layer and the second sub-layer may have different material compositions and/or different aluminum contents.

Preferably, the first sub-layer has a lower modification rate or oxidation rate than the second sub-layer. In modification, the second sublayer may be fully modified while the first sublayer is modified only in its outer regions. For example, in case of oxidation, the second sub-layer may be fully oxidized while the first sub-layer is oxidized only in its outer regions. The retaining element is thus formed to be breakable or detachable, in particular in the regions of the second partial layer. After the component or the semiconductor body has been separated from the intermediate carrier, the first partial layer tends to remain on the intermediate carrier, so that the separated semiconductor body is free of the first partial layer, in particular free of residues of the first partial layer. By using at least two partial layers having different modification rates, in particular oxidation rates, predetermined breaking points can be formed specifically in predetermined regions of the retaining elements or the sacrificial layer. Depending on the applications, it is also conceivable that the second partial layer has a lower modification rate, for example a lower oxidation rate, than the first partial layer.

According to at least one embodiment of the method or of the component assembly, the first sublayer and the second sublayer are based on the same material system, wherein the first sublayer has a lower concentration of aluminum than the second sublayer, or vice versa. It is also possible that one sublayer is aluminum-containing and the other sublayer is free of aluminum. Furthermore, it is possible that the different modification rate or oxidation rate is formed by different doping, e.g. by different degrees of positive or negative doping, or by positive and negative doping.

According to at least one embodiment of the method or of the component assembly, a contact layer and a further contact layer are assigned to each semiconductor body, wherein the contact layer and the further contact layer are configured for electrically contacting the associated semiconductor body.

The contact layer may be arranged laterally to the retaining element on a first main surface of the semiconductor body and may partially cover the first main surface. For example, the contact layer is configured to electrically contact the first semiconductor layer of the semiconductor body. The further contact layer may be arranged on a second main surface of the semiconductor body facing away from the first main surface, and may completely cover the second main surface. The further contact layer may be configured for electrically contacting the second semiconductor layer of the semiconductor body. The first semiconductor layer and the second semiconductor layer may be n-type and p-type, respectively, or vice versa.

According to at least one embodiment of the method or of the component assembly, the contact layer and/or the further contact layer are/is formed from a transparent electrically conductive oxide (TCO), for example from indium tin oxide (ITO). The contact layer and the further contact layer are arranged in particular on opposite sides of the semiconductor body. For example, a main surface of the semiconductor body or the component facing away from the retaining element is formed as a radiation passage surface. The main surface can be covered, in particular completely covered, by a transparent electrically conductive contact layer.

According to at least one embodiment of the method or of the component assembly, a contact layer and a further contact layer are assigned to each semiconductor body, wherein the contact layer and the further contact layer are arranged on the same side of the associated semiconductor body and are configured to electrically connect the semiconductor body. In particular, one of the contact layers is electrically conductively connected to a through-via, wherein the through-via extends in the vertical direction throughout the active zone for electrically contacting a semiconductor layer of the semiconductor body.

The contact layer and the further contact layer are arranged in particular on a rear side of the semiconductor body or of the component. The component may be formed as a surface-mountable component. The front side of the semiconductor body or of the component facing away from the rear side can be formed as a radiation passage surface. It is possible that the radiation passage surface is covered, in particular completely covered, by a protective layer. The protective layer may be electrically insulating. However, it is possible that the protective layer is formed from a transparent electrically conductive material and in this case additionally serves as a current expansion layer for the semiconductor layer.

A component is specified which is produced in particular by a method described herein. In particular, the component has a semiconductor body which is detached from the intermediate carrier of the component assembly. The component may have residues or remnants of the retaining element or of the retaining elements. The features described in connection with the method and the component assembly may be used for the component, and vice versa.

In at least one embodiment of a component, the latter has a semiconductor body which is detached from the component assembly in particular described here. The active zone is configured for generating or detecting electromagnetic radiation. The semiconductor body has a main surface which is covered in regions by residues or by remnants of the retaining element. The residues or remnants of the retaining element are formed in particular from a modified, in particular oxidized material and have a reflecting or scattering effect for the electromagnetic radiation to be emitted or detected during operation of the component.

According to at least one embodiment of the component, the component comprises a carrier and a bonding layer, wherein the semiconductor body is attached to the carrier by the bonding layer. In particular, the residues or remnants of the retaining element are at least partially embedded in the bonding layer. The bonding layer may be an adhesion promoter layer, for example an adhesive layer.

Further advantages, preferred embodiments and further developments of the component, the component assembly as well as of the method are apparent from the exemplary embodiments explained below in connection with FIGS. 1A to 5C:

Figure 1A:
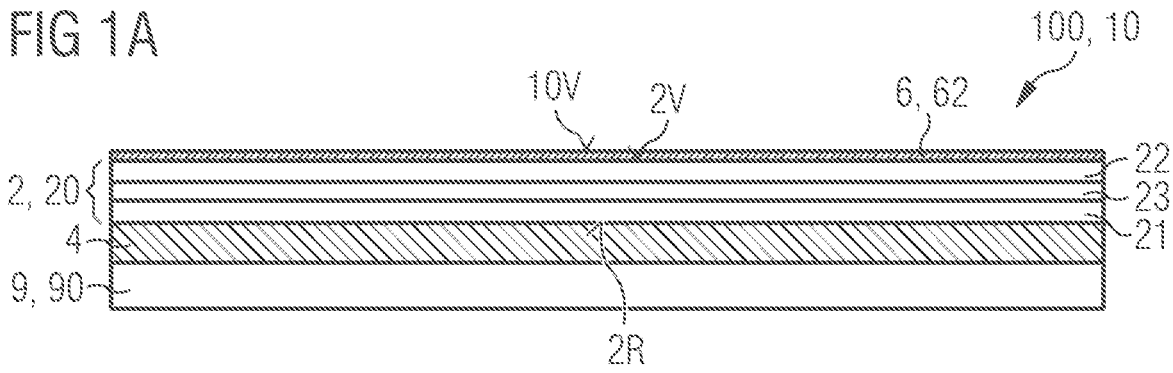
FIGS. 1A, 1B, 1C, 1D, 1E, 1F, 1G and 1H show schematic illustrations of method steps for producing a component assembly or a component.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION

FIG. 1A schematically illustrates a method step for producing a component assembly 100 or for producing a plurality of components 10.

According to FIG. 1A, a semiconductor structure 20 is provided on an intermediate carrier 90, in particular on a growth substrate 9. In particular, the intermediate carrier 90 is a III-V or a II-VI semiconductor substrate. For example, the intermediate carrier is made of gallium arsenide or is based on gallium arsenide. The semiconductor structure 20 has a first semiconductor layer 21, a second semiconductor layer 22 and an active zone 23 disposed between the semiconductor layers 21 and 22. The active zone 23 is particularly configured for emitting or detecting electromagnetic radiation.

The semiconductor structure 20 may be based on a III-V or on a II-VI semiconductor compound material. For example, the semiconductor structure 20 is based on gallium nitride. In particular, the first semiconductor layer 21 is arranged on the n-side. For example, the first semiconductor layer 21 is n-type or n-doped. The second semiconductor layer 22 is arranged in particular on the p-side and can be p-conductive or p-doped. The active zone 23 is in particular a p-n-junction zone. Deviating from this, it is possible that the first semiconductor layer 21 is p-conducting or p-doped and the second semiconductor layer 22 is n-conducting or n-doped.

According to FIG. 1A, a sacrificial layer 4 is arranged in the vertical direction between the semiconductor structure 20 and the intermediate carrier 90. In particular, the sacrificial layer 4 serves as a buffer layer and may be a semiconductor layer epitaxially deposited on the growth substrate 9. For example, the sacrificial layer 4 is an aluminum-containing GaAs or GaP layer.

In particular, the sacrificial layer 4 adjoins a main surface 2R of the semiconductor structure 20, wherein the main surface 2R is a rear side of the semiconductor structure 20 facing the intermediate carrier 90 and may be formed by a surface of the first semiconductor layer 21. The semiconductor structure 20 has a further main surface 2V facing away from the rear side which faces away from the intermediate carrier 90 and may be formed by a surface of the second semiconductor layer 22. The further main surface 2V forms a front side 2V of the semiconductor structure 20.

A contact layer 62 is arranged on the front side 2V of the semiconductor structure 20. The contact layer 62 is part of a contact structure 6 and is provided in particular for electrically contacting the second semiconductor layer 22. For example, the contact layer 62 is formed from a transparent electrically conductive material. The component assembly 100 has a front side 10V, which is formed in particular by an exposed surface of the contact layer 62. The components 10 emerging from the component assembly 100 may each have a front side 10V which is in particular formed as a radiation passage surface, such as a radiation entering surface or a radiation exiting surface.

Figure 1B:
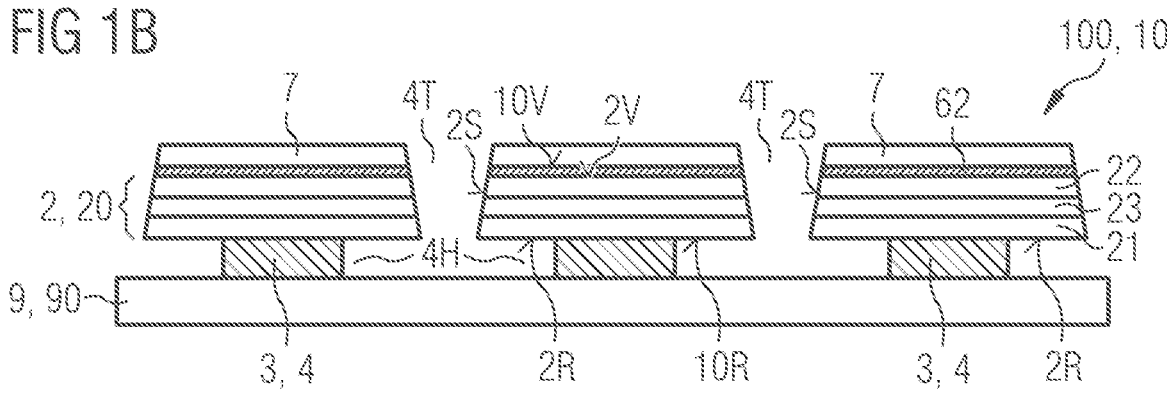

According to FIG. 1B, the semiconductor structure 20 is singulated into a plurality of semiconductor bodies 2. Here, a plurality of separation trenches 4T can be formed along the vertical direction throughout the contact layer 62 and semiconductor structure 20. For this purpose, a mask 7 formed for instance from a photostructurable material may be applied. By suitable exposure of the photostructurable material, openings of the mask 7 can be formed which define the positions of the separation trenches 4T. For forming the separation trenches 4T, materials of the semiconductor structure 20 and/or the contact layer 62 are removed in regions, for example by an etching process, such as a plasma etching process. When the separation trenches 4T are formed, the sacrificial layer 4 may be exposed or at least partially or completely removed in the regions of the separation trenches 4T.

The separation trenches 4T shown in FIG. 1B each have a cross-section that decreases with decreasing distance from the intermediate carrier 90. The singulated semiconductor bodies 2 thus have side surfaces 2S formed obliquely to the main surfaces 2V and 2R. The semiconductor bodies 2 may form main bodies of light emitting diodes (LEDs). For example, the LEDs are μLEDs. The component 10 or the semiconductor bodies have a lateral extent, for example, between 1 μm and 30 μm inclusive. The lateral extent may also be between 1 μm and 5 mm inclusive, such as between 10 μm and 5 mm inclusive, between 300 μm and 5 mm inclusive, between 300 μm and 3 mm inclusive, or between 100 μm and 1 mm inclusive.

Although the singulated semiconductor bodies 2 are spatially spaced apart from each other in the lateral direction, they are still mechanically connected to the intermediate carrier 9 via the sacrificial layer 4, in particular via the structured sacrificial layer 4. After singulation, the semiconductor bodies 2 are mechanically connected to the intermediate carrier 90, in particular exclusively via the sacrificial layer 4.

After singulation, the semiconductor bodies 2 have rear-side main surfaces 2R, which may further be completely covered by the sacrificial layer 4. In a subsequent method step, cavities 4H can be formed between the semiconductor bodies 2 and the intermediate carrier 90, for example by an etching process, for instance by a wet chemical etching process. Here, the sacrificial layer 4 can be removed locally in such a way that the rear-side main surfaces 2R, which in FIG. 1B form rear sides 10R of the components 10, are only partially covered by the sacrificial layer 4. As a result of which the semiconductor bodies 2 are detached from the intermediate carrier 90 in regions. The remaining areas of the sacrificial layer 4 form several retaining elements 3 which continue to provide a mechanical connection between the semiconductor bodies 2 and the intermediate carrier 90.

Deviating from FIG. 1B, it is possible that the cavities 4H are formed exclusively by the separation trenches 4T. In this case, the retaining elements 3 can each completely cover a rear-side main surface 2R of the associated semiconductor body 2 or completely cover it except for production tolerances.

The retaining elements 3 may be in the form of retaining posts which are completely covered by the semiconductor bodies when viewed from above on the intermediate carrier 90 (FIG. 1B). It is possible for each semiconductor body 2 to have a single retaining element 3 or multiple retaining elements 3. The separation trenches 4T may be free of the retaining elements 3 or free of a material of the sacrificial layer 4. Alternatively, it is possible that retaining elements 3 are located regionally below the semiconductor bodies 2 and regionally in the separation trenches (FIGS. 2B, 2C and 2D).

Figure 1C:
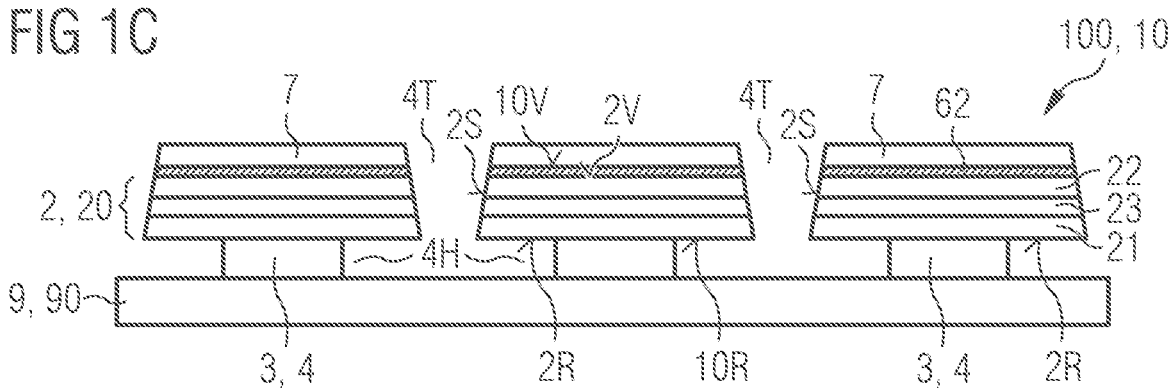

According to FIG. 1C, the retaining elements 3 are modified, in particular oxidized. The modification reduces the adhesion between the semiconductor bodies 2 and the intermediate carrier 90. This is due in particular to the deterioration of the material quality, such as the deterioration of the crystal quality of the retaining elements 3. In particular, pores are formed in the retaining elements 3 as a result of the modification. The retaining elements 3 thus become more porous and are therefore easier to break mechanically or to detach from the semiconductor bodies 2 or from the intermediate carrier 90.

Figure 1D:
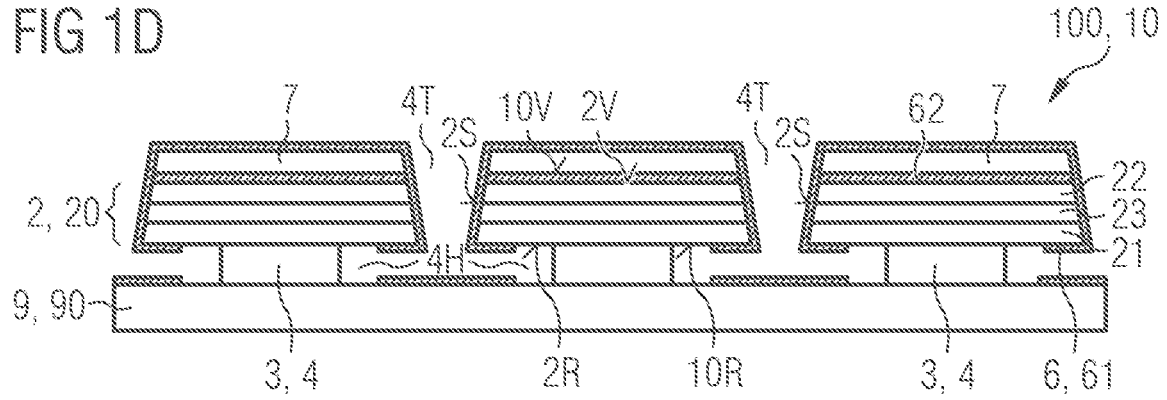

According to FIG. 1D, a further contact layer 61 is formed which is part of the contact structure 6 and is configured in particular for making electrical contact with the first semiconductor layer 21. In particular quite analogously to the contact layer 62, the further contact layer 61 can be applied to the semiconductor bodies 2 by a deposition process. In top view, the further contact layer 61 may completely cover the mask 7, the semiconductor bodies 2, the side surfaces 2S of the semiconductor bodies 2, and an exposed surface of the intermediate carrier 90. Temporarily, the semiconductor body 2 may be electrically short-circuited. In particular, the further contact layer 61 is adjacent to the first semiconductor layer 21 and forms an electrical contact with the first semiconductor layer 21. The rear side 2R of the respective semiconductor body 2 is covered in regions by the further contact layer 61 and in regions by the retaining element 3 or retaining elements 3. In particular, the retaining element 3 may be surrounded by the further contact layer 61 in lateral directions. The retaining element 3 can be laterally spaced from the further contact layer 61. According to FIG. 1E, the mask 7 is removed. The further contact layer 61 is removed from the side surfaces 2S. The temporary electrical short circuit is thus overcome. The semiconductor body 2 can be electrically contacted externally via the contact layer 62 and the further contact layer 61.

Figure 1E:
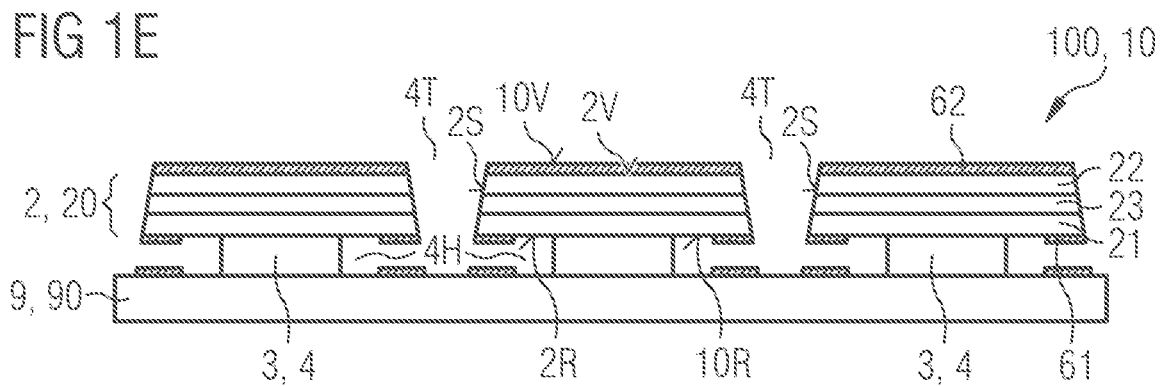
Figure 1F:
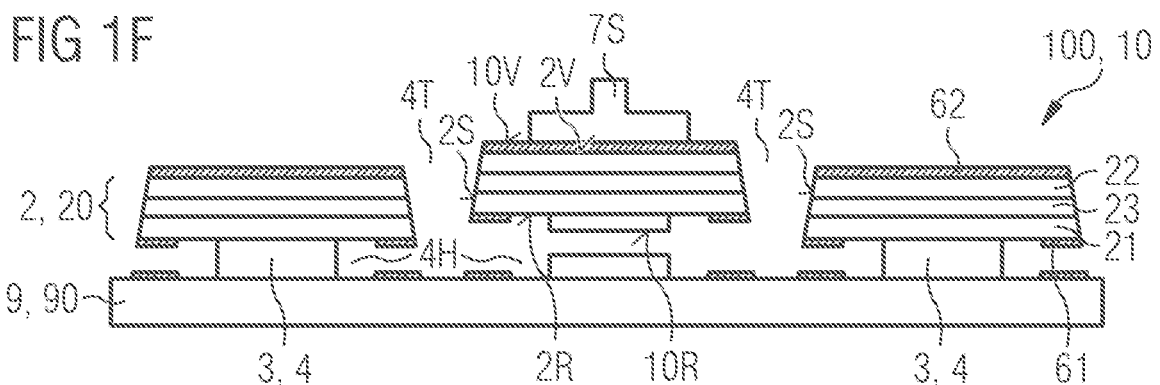

FIG. 1F schematically illustrates that an individual component 10 or an individual semiconductor body 2 can be selectively separated from the intermediate carrier 90, for example, by an adhering stamp 7S. However, the components 10 or the semiconductor bodies 2 can be separated from the intermediate carrier 9 individually or in groups with the aid of the stamp 7S or of a plurality of stamps 7S and can be applied to a target surface in the same method step, where they are mechanically fixed and electrically contacted. Here, the semiconductor bodies 2 are selectively removed from the intermediate carrier 90 by locally mechanically breaking or by detaching the retaining elements 3.

Figure 1G:
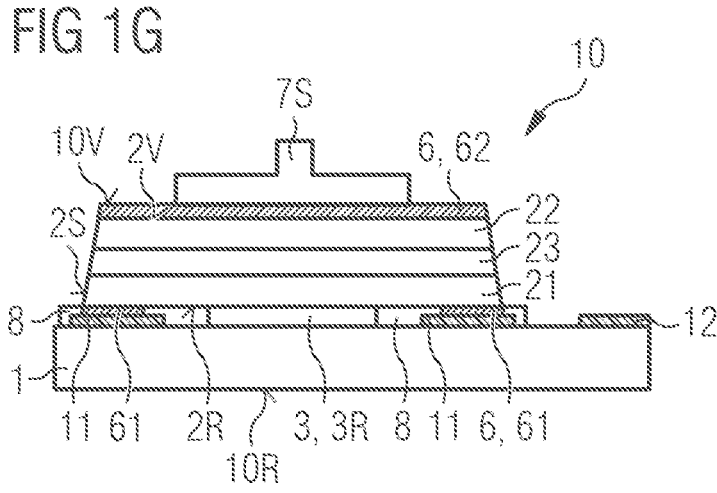

According to FIG. 1G, the separated semiconductor body 2 can be mechanically fixed on a carrier 1, for example, by a bonding layer 8. The residues 3R or remnants 3R of the retaining element 3 may be at least partially embedded in the bonding layer 8. The carrier 1 may have a terminal layer 11 which is electrically conductively connected to the contact layer 61. The contact layer 61 and the terminal layer 11 may be surrounded by the terminal layer 81. The bonding layer 81 may be a bonding agent layer, such as an adhesive layer. It is also possible for the bonding layer 81 to be a solder layer or an electrically conductive adhesive layer.

The carrier 1 has a further terminal layer 12. According to FIG. 1H, an electrical connection 13, for example in the form of a bonding wire or a planar contact, can be formed between the terminal layer 12 and the contact layer 62 after the stamp 7S has been removed. The terminal layers 11 and 12 may be formed as connection pads or as conductor tracks on the carrier 1. The carrier 1 comprising the terminal layers 11 and 12 may be a printed circuit board or a Si-based board.

Figure 1H:
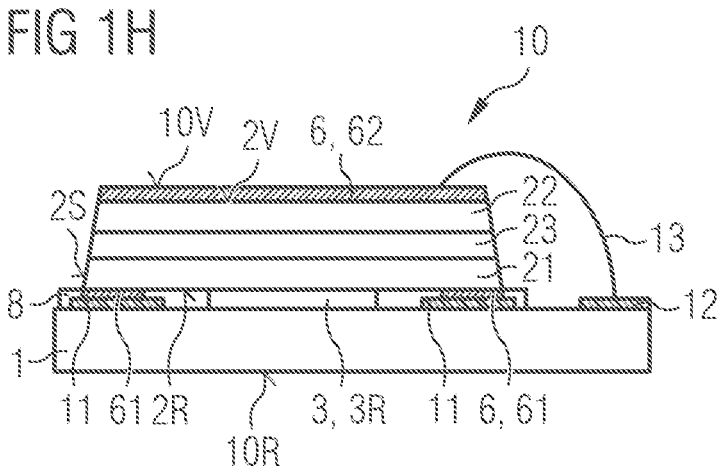

According to FIG. 1H, the component 10 thus has a semiconductor body 2 on a carrier 1, wherein the semiconductor body 2 is mechanically fixed to the carrier 1 by a bonding layer 8. The front side 10V of the component 10 is formed by an exposed surface of the contact layer 62. The back surface 10R of the component 10 is formed by an exposed surface of the carrier 1. The contact layer 61 and the residues 3R of the retaining member only partially cover the rear-side main surface 2R of the semiconductor body 2. Deviating from FIG. 1H, it is possible that a plurality of such semiconductor bodies 2 are arranged on the carrier 1.

The semiconductor body 2 has side surfaces 2S that form an acute angle with the rear-side main surface 2R that is, for example, between 20° and 80°, for instance between 30° and 70° inclusive or between 30° and 60°. Accordingly, the side surfaces 2S form with the front-side main surface 2V an obtuse angle which is, for example, between 110° and 170°, for instance between 120° and 160° inclusive or between 120° and 150°. Deviating from this, it is possible that the side surfaces 2S form a right angle or a substantially right angle with the main surfaces 2V and 2R.

Figure 2A:
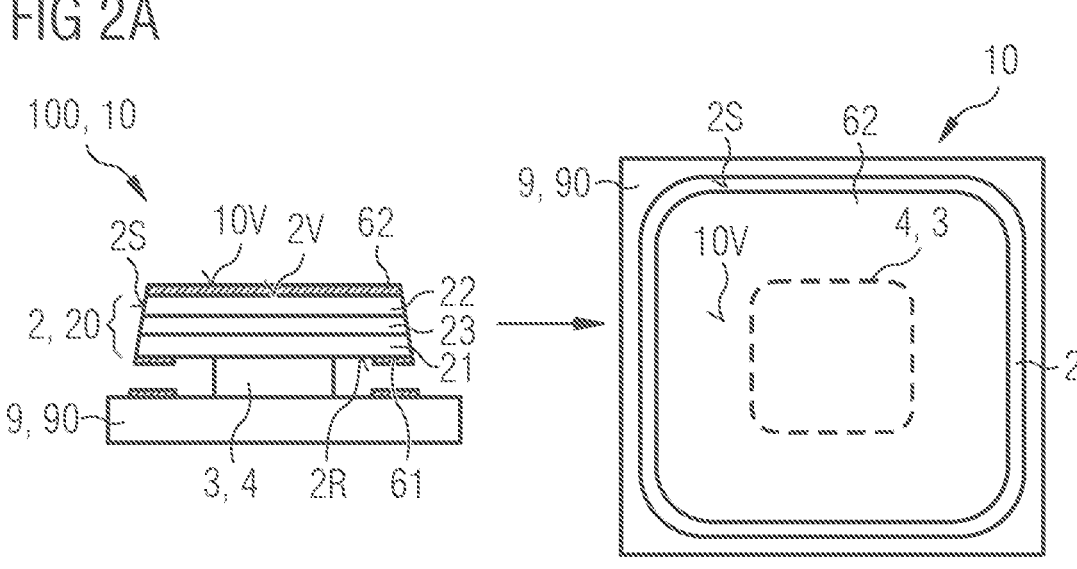
FIGS. 2A, 2B, 2C, and 2D show schematic illustrations of various exemplary embodiments of a component assembly, and FIGS. 3A, 3B, 3C, 4A, 4B, 4C, 5A, 5B and 5C schematic illustrations of various method steps of further exemplary embodiments of a method for producing a component assembly or a component.
Figure 2B:
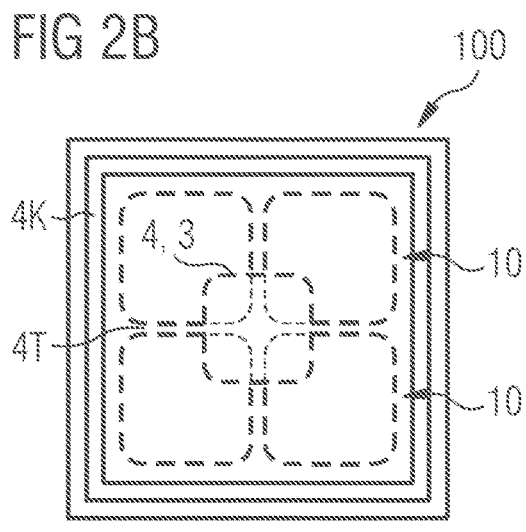
Figure 2C:
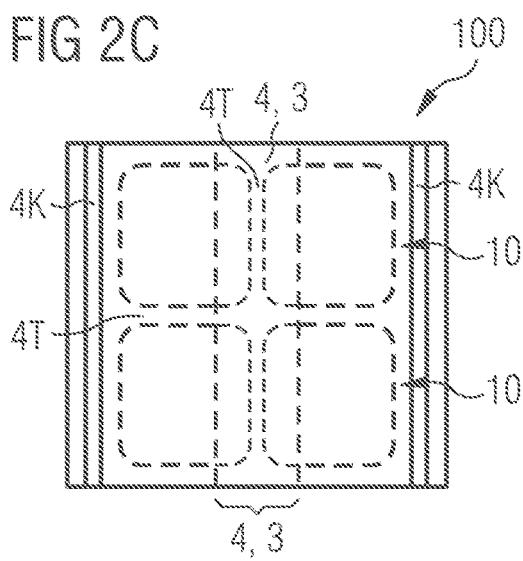
Figure 2D:
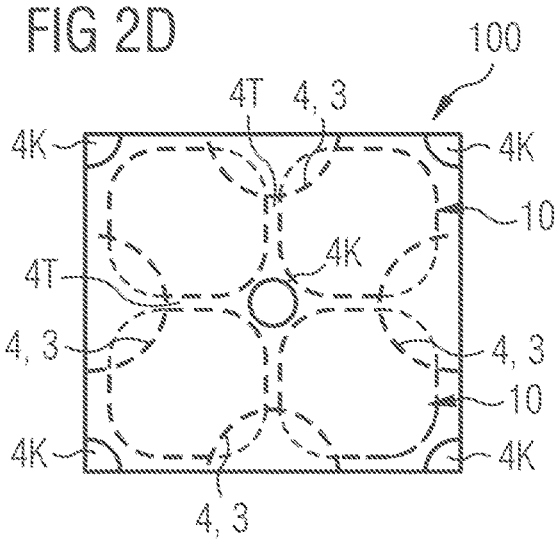

FIG. 2A shows a section of the exemplary embodiment shown in FIG. 1E in sectional view and in top view. According to FIG. 2A, the retaining element 3 is arranged centrally below the semiconductor body 2. In particular, a single retaining element is uniquely assigned to each semiconductor body 2, and vice versa. In a top view of the intermediate carrier 90, the semiconductor body 2 completely covers the retaining element 3 associated therewith.

FIGS. 2B, 2C and 2D schematically show further exemplary arrangements of the retaining elements 3. Also shown in these figures are entry channels 4K, which are configured in particular for introducing the etchant for forming the cavities 4H.

According to FIGS. 2B, 2C, and 2D, a plurality of semiconductor bodies 2 or a plurality of components 10 share a common retaining element 3. The common retaining element 3 is partially located in the separation trenches 4T and partially located below the semiconductor bodies 2 of the components 10. In this case, the common retaining element may laterally bridge one separation trench 4T or a plurality of separation trenches 4T.

According to FIG. 2B, four adjacent semiconductor bodies 2 or components 10 share a common retaining element 3 located in the corner regions of the semiconductor bodies 2 or of the components 10 and in a crossing point of the separation trenches 4T. The common retaining element 3 only partially covers the separation trenches 4T.

According to FIG. 2C, two adjacent rows of the semiconductor bodies 2 or the components 10 share a common retaining element 3 which extends along a separation trench 4T between the two adjacent rows of the semiconductor bodies 2 and, in top view, may completely cover this separation trench 4T. Further separation trenches between the semiconductor bodies 2 may be partially covered by the common retaining element. In FIG. 2C, the entry channels 4K are located in the separation trenches 4T and extend along the rows of the semiconductor bodies 2 or the components 10.

The exemplary embodiment shown in FIG. 2D is essentially the same as the exemplary embodiment shown in FIG. 2B. While the entry channels in FIG. 2B frame the components 10, the entry channels in FIG. 2D are located in the intersections of the separation trenches 4T. Two or four adjacent components 10 may share a common retaining element 3. In particular, the common retaining element 3 is located in a crossing point of the separation trenches 4T.

Figure 3A:
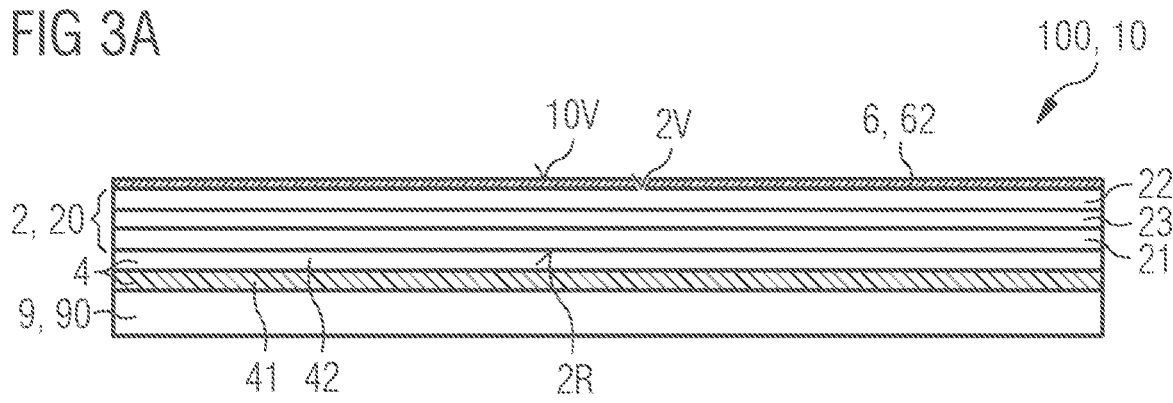

The exemplary embodiment illustrated in FIG. 3A essentially corresponds to the exemplary embodiment illustrated in FIG. 1A describing a method step for producing a component assembly 100 or a plurality of components 10. In contrast, the sacrificial layer 4 has a first sublayer 41 and a second sublayer 42. The second sub-layer 42 is located in the vertical direction between the first sub-layer 41 and the semiconductor structure 20. In particular, the sub-layers 41 and 42 are formed of different materials or have different material compositions so that the sub-layers 41 and 42 have different modification rates, in particular different oxidation rates. For example, the sublayers 41 and 42 have different concentrations of aluminum.

Figure 3B:
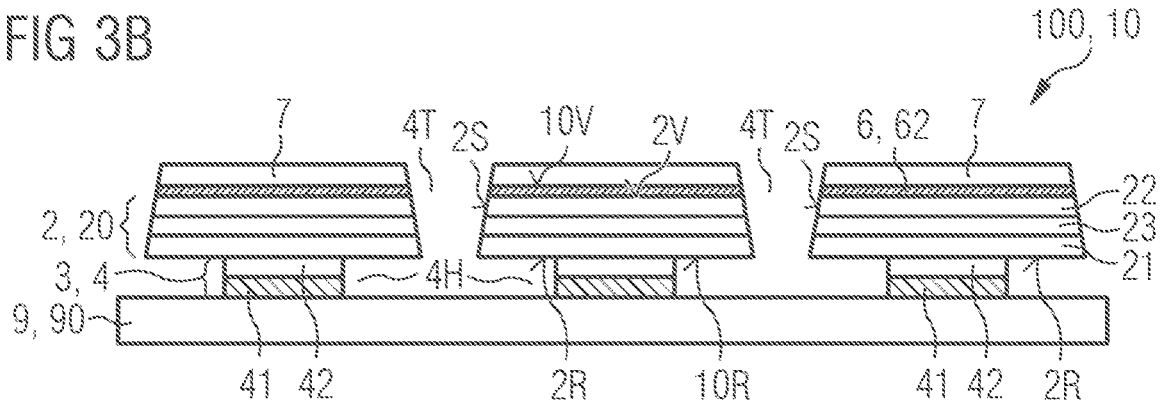

The exemplary embodiment shown in FIG. 3B is essentially the same as the exemplary embodiment shown in FIG. 1B, except that the retaining elements 3 each have a first sublayer 41 and a second sublayer 42.

Figure 3C:
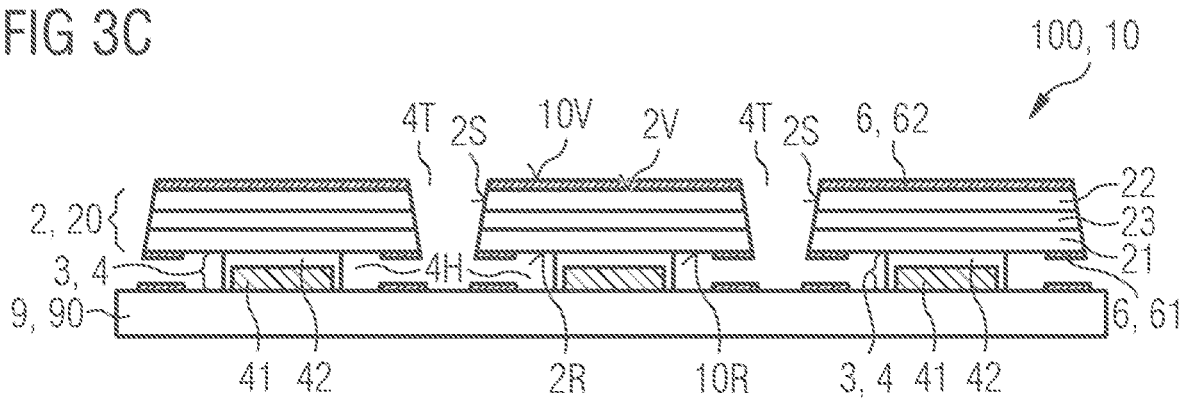

The exemplary embodiment shown in FIG. 3C essentially corresponds to the exemplary embodiment shown in FIG. 1E describing a method step for producing a component assembly 100 or a plurality of components 10. In contrast, the retaining element 3 has a first sublayer 41 which is only partially modified or oxidized. The retaining element 3 has a second partial layer 42, which is in particular fully modified or fully oxidized. In this case, the predetermined breaking points are located within the second partial layer 42 or at an interface between the second partial layer 42 and the semiconductor body 2 or at an interface between the second partial layer 42 and the first partial layer 41.

Figure 4A:
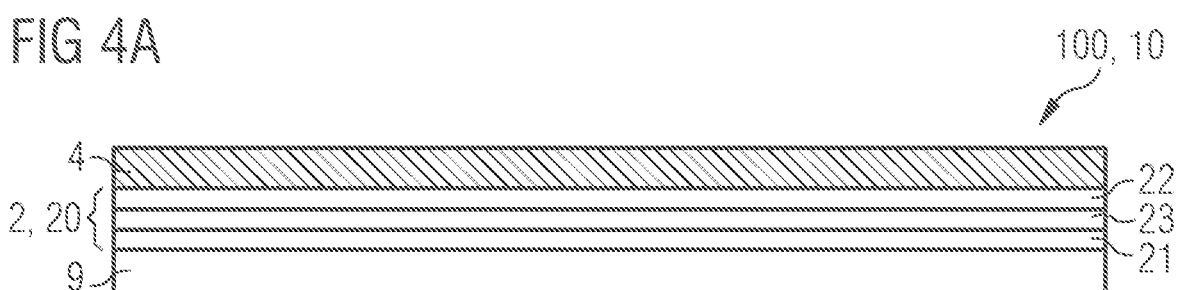

The exemplary embodiment shown in FIG. 4A is substantially the same as the exemplary embodiment shown in FIG. 1A of a method step for producing a component assembly 100 or a plurality of components 10. In contrast, the semiconductor structure 20 is located in the vertical direction between the growth substrate 9 and the sacrificial layer 4. The sacrificial layer 4 may be a semiconductor layer epitaxially deposited on the semiconductor structure 20. It is also possible for the sacrificial layer 4 to be different from a semiconductor layer. For example, the sacrificial layer 4 may be an adhesion promoting layer between the semiconductor structure 20 and the intermediate carrier 90, for instance shown in FIG. 4B.

Figure 4B:
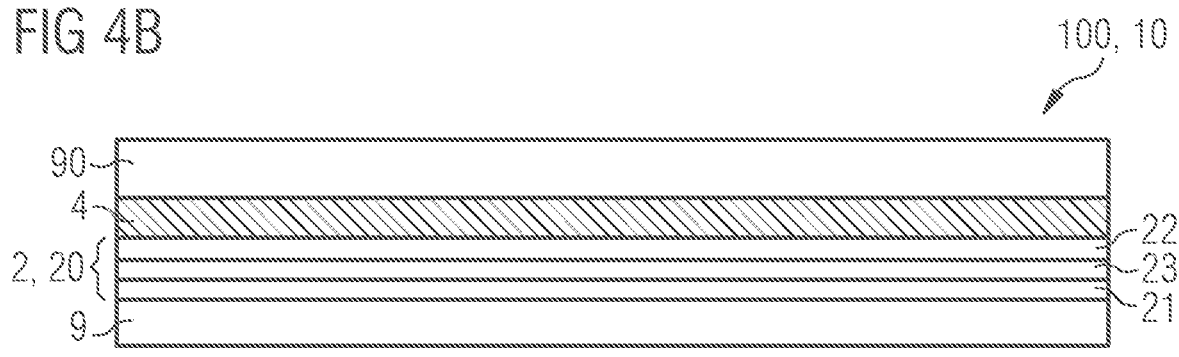
Figure 4C:
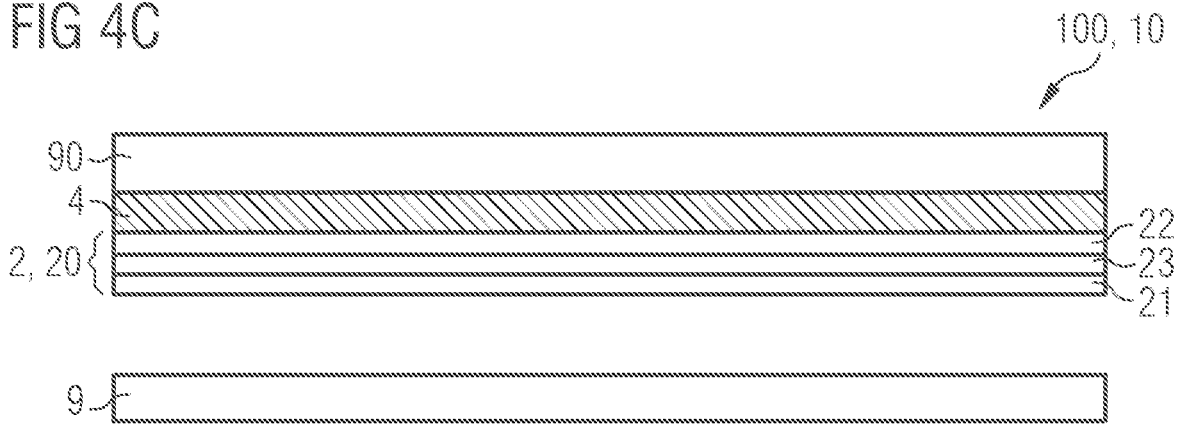

According to FIG. 4C, the growth substrate 9 is removed from the semiconductor structure 20. Further subsequent method steps for producing the component assembly 100 or the plurality of components 10 may be given by the method steps according to FIGS. 1A to 1H.

Figure 5A:
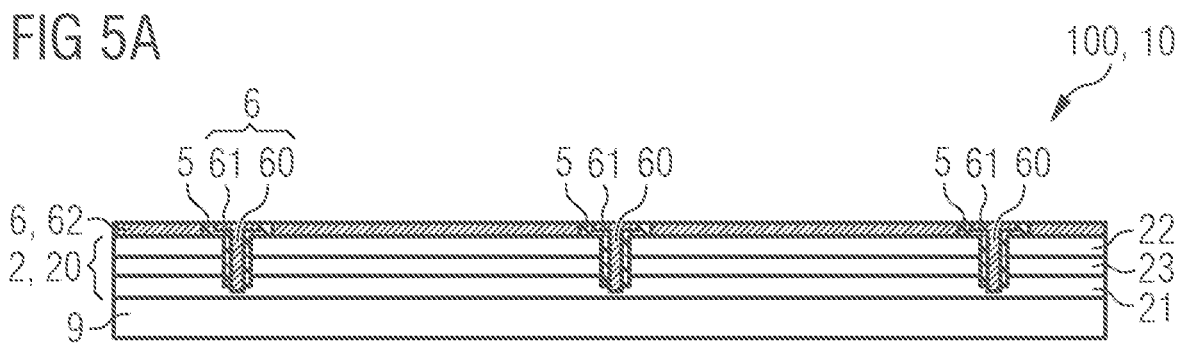
Figure 5B:
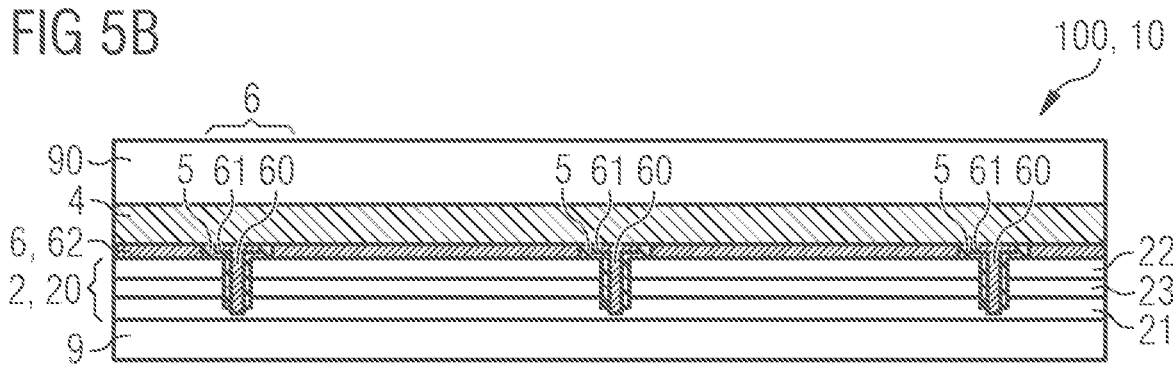
Figure 5C:
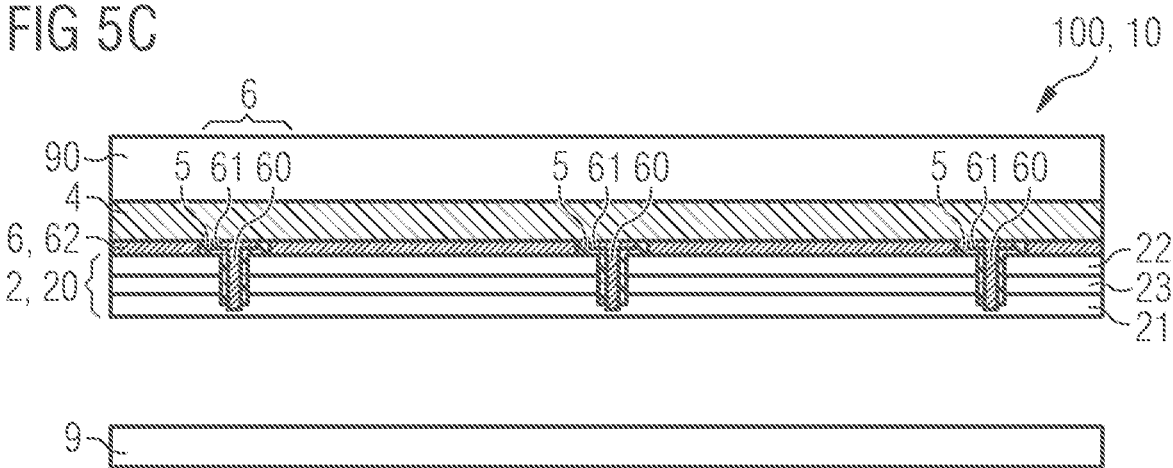

The exemplary embodiments shown in FIGS. 5A, 5B, and 5C are substantially the same as the exemplary embodiments shown in FIGS. 4A, 4B, and 4C, respectively, describing some method steps for producing a component assembly 100 or a plurality of components 10. In contrast, a contact structure 6 is formed on the semiconductor structure 20 prior to the forming of the sacrificial layer 4.

In particular, the contact structure 6 includes a contact layer 62 for electrically contacting the semiconductor layer 22. Furthermore, the contact structure 6 includes a plurality of through-vias 60 extending throughout the semiconductor layer 22 and the active zone 23 into the semiconductor layer 21. The contact structure 6 further includes a plurality of contact layers 61, each of which is electrically conductively connected to one through-via 60 or to a plurality of through-vias 60. The contact layers 61 and the through-vias 60 are configured to electrically contact the semiconductor layer 21.

Electrically insulating the contact layers 61 and the through-vias 60 from the active zone 23 and the semiconductor layer 22 and from the further contact layer 62 is provided by an insulation structure 5, which is located in regions within the semiconductor structure 20 and on the semiconductor structure 20. In particular, the contact layer 61, the further contact layer 62 and the insulation layer 5 are located, at least in regions, on the same side of the semiconductor structure.

Further subsequent method steps for producing the component assembly 100 or the plurality of components 10 may be given by the method steps according to FIGS. 1B, 1C and 1G. In comparison with the exemplary embodiments shown in FIGS. 1C, 1G and 1H, a component 10 or the component assembly 100 manufactured according to FIGS. 5A to 5C has a contact structure 6 which is accessible in particular exclusively on the rear side 2R of the semiconductor body 2.

Using the method described here, many intermediate steps, for example with regard to the assembling, electrical contacting or intermediate storage of the semiconductor bodies, can be dispensed with. In addition, the semiconductor bodies can be applied directly to a mounting surface of a carrier, which is in particular a printed circuit board, so that no further intermediate carrier is required between the carrier and the semiconductor body. The internal mechanical tensions can thus be reduced. The semiconductor bodies can also be smaller and thinner in design, since, for example, the mask and the sacrificial layer can be adapted accordingly in a simplified manner. An out-coupling of the radiation via the side surfaces of the semiconductor body can also be increased. In addition, there is the possibility that the growth substrate can be re-used.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

The invention claimed is:

1. A method for producing a plurality of components each comprising a semiconductor body having an optically active zone, comprising:

providing a semiconductor structure on an intermediate carrier, wherein a sacrificial layer is disposed in a vertical direction between the semiconductor structure and the intermediate carrier;

forming a plurality of separation trenches throughout the semiconductor structure for forming a plurality of laterally spaced semiconductor bodies, wherein after formation of the separation trenches, the sacrificial layer is removed in such a way that cavities are formed in the vertical direction between the intermediate carrier and the semiconductor bodies, wherein remaining partial regions of the sacrificial layer form retaining elements; and modifying the retaining elements, namely the remaining partial regions of the sacrificial layer, for reducing mechanical adhesion between the semiconductor bodies and the intermediate carrier, so that the semiconductor bodies are formed to be detachable from the intermediate carrier, wherein in a top view of the intermediate carrier, the semiconductor bodies overlap the retaining elements as well as the cavities, and wherein the modification is effected by oxidation.

2. The method according to claim 1, wherein the sacrificial layer and the semiconductor structure are based on the same semiconductor material system.

3. The method according to claim 1, wherein, after modification of the retaining elements, the semiconductor bodies are mechanically connected to the intermediate carrier exclusively via the modified retaining elements, wherein the components are formed to be detachable from the intermediate carrier and thus transferable, and the semiconductor bodies are released from the intermediate carrier under mechanical load, by irradiation or by etching the retaining elements.

4. The method according to claim 1, wherein the semiconductor bodies are removed from the intermediate carrier individually or in groups by one or a plurality of stamps, wherein the retaining elements release the semiconductor bodies from the intermediate carrier under mechanical load of the stamp or stamps, and the semiconductor bodies are fixed on one carrier or on several carriers before being detached from the stamp or stamps.

5. The method according to claim 1, wherein the semiconductor bodies are removed from the intermediate carrier individually or in groups, and an absorption layer is irradiated to release the semiconductor bodies from the intermediate carrier, wherein the absorption layer is part of the retaining elements, and is embedded within the retaining elements, or is arranged facing the intermediate carrier or facing the semiconductor bodies.

6. The method according to claim 1, wherein the intermediate carrier is a growth substrate, the semiconductor structure being epitaxially deposited on the growth substrate, and the sacrificial layer being deposited in the vertical direction between the semiconductor structure and the intermediate carrier.

7. The method according to claim 1, wherein the semiconductor structure is a layer sequence epitaxially deposited on a growth substrate, wherein the semiconductor structure and the sacrificial layer are arranged in the vertical direction between the growth substrate and the intermediate carrier, and wherein after the semiconductor structure is attached to the intermediate carrier, the growth substrate is removed.

8. The method according to claim 1, wherein the sacrificial layer is an aluminum containing semiconductor layer.

9. A component assembly comprising of a plurality of components, a modified sacrificial layer and a common intermediate carrier, wherein the components each comprise a semiconductor body having an active zone, the semiconductor bodies being disposed on the common intermediate carrier and being laterally spaced from each other by separation trenches, the sacrificial layer is arranged in a vertical direction between the common intermediate carrier and the semiconductor bodies, the sacrificial layer having a plurality of retaining elements between the semiconductor bodies and the common intermediate carrier, and the semiconductor bodies being mechanically connected to the common intermediate carrier exclusively via the retaining elements, the retaining elements are surrounded by cavities in lateral directions, and the semiconductor bodies are formed to be detachable from the common intermediate carrier, wherein the retaining elements are configured to release the semiconductor bodies from the common intermediate carrier under mechanical load or by irradiation or by etching, wherein the semiconductor bodies are based on GaAs or on GaP and the sacrificial layer is an aluminum-containing GaAs or GaP layer.

10. The component assembly according to claim 9, wherein the retaining elements are arranged exclusively below the semiconductor bodies and in a top view of the common intermediate carrier, the semiconductor bodies completely cover the retaining elements.

11. The component assembly according claim 9, wherein at least one of the retaining elements is arranged both below the semiconductor bodies and laterally of the semiconductor bodies in the separation trenches, wherein the at least one retaining element is assigned to a plurality of semiconductor bodies at the same time and thus is simultaneously covered by a plurality of semiconductor bodies.

12. The component assembly according to claim 9, wherein a contact layer and a further contact layer are assigned to each semiconductor body, wherein the contact layer and the further contact layer are configured for electrically contacting an associated semiconductor body, the contact layer is disposed laterally of a retaining element on a first main surface of the semiconductor body and partially covers the first main surface, and the further contact layer is arranged on a second main surface of the semiconductor body facing away from the first main surface and completely covers the second main surface.

13. The component assembly according to claim 9, wherein a contact layer and a further contact layer are assigned to each semiconductor body, wherein the contact layer and the further contact layer are arranged on the same side of an associated semiconductor body and are configured for electrically contacting the semiconductor body, one of the contact layers is electrically conductively connected to a through-via, and the through-via extends in vertical direction throughout the active zone for electrically contacting a semiconductor layer of the semiconductor body.

14. The component assembly according to claim 9, wherein the sacrificial layer has a plurality of sublayers, the sublayers having different modification rates.

15. The component assembly according to claim 14, wherein the sublayers are based on the same material system, the sublayers having different concentrations of aluminum or different dopants.

16. A component assembly comprising of a plurality of components, a modified sacrificial layer and a common intermediate carrier, wherein the components each comprise a semiconductor body having an active zone, the semiconductor bodies being disposed on the common intermediate carrier and being laterally spaced from each other by separation trenches, the sacrificial layer is arranged in a vertical direction between the common intermediate carrier and the semiconductor bodies, the sacrificial layer having a plurality of retaining elements between the semiconductor bodies and the common intermediate carrier, and the semiconductor bodies being mechanically connected to the common intermediate carrier exclusively via the retaining elements, the retaining elements are surrounded by cavities in lateral directions, and the semiconductor bodies are formed to be detachable from the common intermediate carrier, wherein the retaining elements are configured to release the semiconductor bodies from the common intermediate carrier under mechanical load or by irradiation or by etching, wherein at least one of the retaining elements is arranged both below the semiconductor bodies and laterally of the semiconductor bodies in the separation trenches, wherein the at least one retaining element is assigned to a plurality of semiconductor bodies at the same time and thus is simultaneously covered by a plurality of semiconductor bodies.

\* \* \* \* \*